(12) United States Patent
Kalinin et al.

(10) Patent No.: US 7,759,713 B2
(45) Date of Patent: Jul. 20, 2010

(54) FERROELECTRIC TUNNELING ELEMENT AND MEMORY APPLICATIONS WHICH UTILIZE THE TUNNELING ELEMENT

(75) Inventors: Sergei V. Kalinin, Knoxville, TN (US); Hans M. Christen, Knoxville, TN (US); Arthur P. Baddorf, Knoxville, TN (US); Vincent Meunier, Knoxville, TN (US); Ho Nyung Lee, Oak Ridge, TN (US)

(73) Assignee: UT-Battelle, LLC, Oak Ridge, TN (US)

( * ) Notice: Subject to any disclaimer, the term of this patent is extended or adjusted under 35 U.S.C. 154(b) by 74 days.

(21) Appl. No.: 11/368,550

(22) Filed: Mar. 6, 2006

(65) Prior Publication Data
US 2007/0205448 A1   Sep. 6, 2007

(51) Int. Cl.
*H01L 31/62* (2006.01)
(52) U.S. Cl. ............... 257/295; 257/E43.001; 257/E21.436; 438/3
(58) Field of Classification Search .......... 257/295
See application file for complete search history.

(56) References Cited
U.S. PATENT DOCUMENTS
5,541,422 A   7/1996   Wolf et al.
2002/0089005 A1*   7/2002   Wickramasinghe et al. . 257/295
2004/0145850 A1*   7/2004   Fukumoto et al. ........... 361/143

FOREIGN PATENT DOCUMENTS
DE   10059357   6/2002

* cited by examiner

*Primary Examiner*—Quoc D Hoang
*Assistant Examiner*—Tony Tran
(74) *Attorney, Agent, or Firm*—Michael E. McKee

(57) ABSTRACT

A tunneling element includes a thin film layer of ferroelectric material and a pair of dissimilar electrically-conductive layers disposed on opposite sides of the ferroelectric layer. Because of the dissimilarity in composition or construction between the electrically-conductive layers, the electron transport behavior of the electrically-conductive layers is polarization dependent when the tunneling element is below the Curie temperature of the layer of ferroelectric material. The element can be used as a basis of compact 1R type non-volatile random access memory (RAM). The advantages include extremely simple architecture, ultimate scalability and fast access times generic for all ferroelectric memories.

3 Claims, 3 Drawing Sheets

US 7,759,713 B2

FERROELECTRIC TUNNELING ELEMENT AND MEMORY APPLICATIONS WHICH UTILIZE THE TUNNELING ELEMENT

This invention was made with Government support under Contract No. DE-AC05-00OR22725 awarded by the U.S. Department of Energy to UT-Battelle, LLC, and the Government has certain rights to the invention.

BACKGROUND OF THE INVENTION

This invention relates generally to structures employing thin film materials and relates, more particularly, to electronic devices and structures which utilize thin film ferroelectric materials.

The class of structures with which this invention is to be compared includes tunneling structures which include two conducting electrodes and a ferroelectric layer sandwiched between the two conducting layers. A remanent polarization can be induced within the ferroelectric layer (i.e. below the Curie temperature of the ferroelectric layer) so that the ferroelectric layer provides a barrier to electron flow unless a voltage difference which is greater than a threshold voltage is applied across the electrodes. An example of such a tunneling structure is shown and described in U.S. Pat. No. 5,541,422.

Heretofore, the development of structures such as that described in the referenced patent have focused primarily upon the ferroelectric layer, as opposed to the electrodes, for the control of the electron transport behavior within the structure. It would be desirable to provide a tunneling structure of the aforedescribed class whose transport behavior can be effected or controlled by techniques other than through the selection or build up of the ferroelectric layer.

Accordingly, it is an object of the present invention to provide a new and improved tunneling element of the aforedescribed class whose transport behavior is advantageously affected by means other than through the selection or construction of the ferroelectric layer.

Another object of the present invention is to provide such an element which is particularly well-suited for use in memory structures employing relatively simple architecture and can reduce the volatility-related limitations associated with current memory chips and provide fast access times.

Yet another object of the present invention is to provide such an element which, when incorporated within a memory device, advantageously effects the ultimate scalability of the memory device and accommodates fast access times generic for all ferroelectric memories.

A further object of the present invention is to provide a memory device which utilizes the new and improved tunneling element.

A yet further object of the present invention is to provide such a structure which is uncomplicated in structure, yet effective in operation.

SUMMARY OF THE INVENTION

This invention resides in a ferroelectric tunneling element including a thin film layer of ferroelectric material and a pair of electrically-conductive layers disposed on opposite sides of the ferroelectric layer. One of the conductive layers is dissimilar to the other of the conductive layers in composition or construction so that when the tunneling element is below the Curie temperature of the layer of ferroelectric material, the electron transport behavior of the conductive layers is polarization dependent.

DETAILED DESCRIPTION OF AN ILLUSTRATIVE EMBODIMENT

Figure 1:
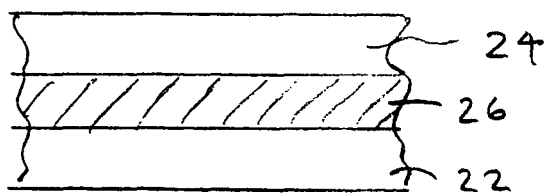
FIG. 1 is a cross-sectional view of an embodiment of a ferroelectric tunneling element within which features of the present invention are embodied.
Figure 2:
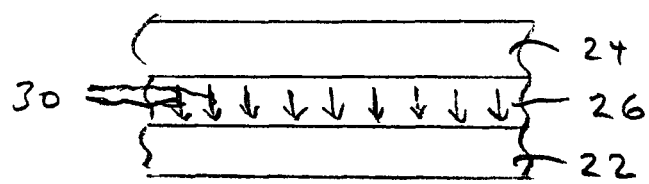
FIG. 2 is a view similar to that of FIG. 1 illustrating the direction of the spontaneous polarization of the ferroelectric layer of the FIG. 1 element.
Figure 3:
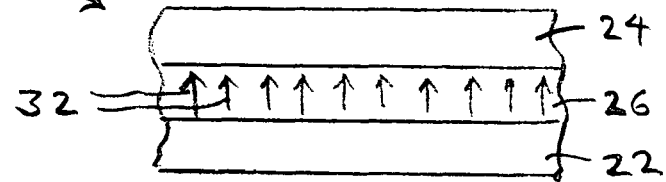
FIG. 3 is a view similar to that of FIG. 1 illustrating the direction of the polarization of the ferroelectric layer of the FIG. 1 element after having been switched from the condition of FIG. 2.

Turning now to the drawings in greater detail and considering first FIGS. 1-3, there is illustrated an embodiment, generally indicated 20, of an asymmetric ferroelectric tunneling element within which features of the present invention are embodied. More specifically, the tunneling element 20 includes one electrically-conductive layer 22 which provides a first electrode for the element 20, another electrically-conductive layer 24 which provides a second electrode for the element 20, and a thin film layer 26 of a ferroelectric material sandwiched between the electrodes 22 and 24.

Preferably, the layers 22, 24, and 26 are constructed atop one another so that each layer is epitaxial with it adjacent layer. Such an epitaxial build-up of materials can be performed with pulsed laser deposition of the nature currently employed to grow multicomponent oxide thin films, but other build-up methods, such as molecular beam epitaxy (MBE) techniques, are possible. Moreover, the electrically-conductive layers 22 and 24 of the depicted element 20 can be comprised of a metal or semiconductor materials, but are dissimilar from one another in composition or construction, as will be apparent herein. In the depicted element 20, one conducting layer 22 is comprised of an n-doped semiconductor material, while the other conducting layer 24 is comprised of a p-doped semiconductor material, but the conducting layers 22 and 24 can be comprised of materials possessing dissimilar compositions or constructions, as will be apparent herein.

The ferroelectric layer 26 of the element 20 is in a paraelectric state when at a temperature which is above its Curie temperature in that the ferroelectric layer 26 provides a barrier to the flow of electrons between the conductive layers 22 and 24. In other words, in the high temperature regime above Curie temperature, the element 20 acts as a common semiconductor-insulator-semiconductor tunneling barrier.

However, below the Curie temperature, the ferroelectric layer 26 possesses a spontaneous polarization whose direction of polarization (within the depicted element 20) corresponds with the direction of the arrows 30 of FIG. 2 (i.e. along paths oriented substantially normal to and directed toward the interface between the conducting layer 22 and the ferroelectric layer 26). As is known in the art, a ferroelectric layer, such as the layer 26, may possess random polarization upon completion of its build-up, but the direction of polarization can be set, or selected, within the layer to be oriented toward one or the other of the conducting layers (e.g. either upwardly or downwardly as viewed in FIG. 2) upon application of a suitable voltage differential between the conducting layers.

Accordingly and in any event, the material of the ferroelectric layer 26 can be any of a number of ferroelectric materials which possesses a spontaneous polarization below Curie temperature. Such ferroelectric materials can include perovskites, ferroelectric polymers—such as polyvinilidene difluoride (PVPS) and its copolymers, other ferroelectric polymers, ferroelectric liquid crystals and self-assembled monolayers on its base, and polar molecular self-assembled monolayers. When the element 20 is in the FIG. 2 condition, the polarization charge therein results in the formation of accumulation layers with high carrier concentration on both sides of the ferroelectric layer 26, corresponding to a condition of high device conductance (i.e. between the conducting layers 22 and 24.

In contrast and with reference to FIG. 3, the application of a sufficiently high bias (e.g. a voltage differential) across the conducting layers 22 and 24 results in the switching of the direction of polarization in the ferroelectric layer 26 to correspond with the direction of polarization depicted by the arrows 32 of FIG. 3. When the element 20 is in the FIG. 3 condition, the polarization charge results in the formation of depletion layers adjacent the conducting layer/ferroelectric layer interfaces which possess low carrier concentration, resulting in the increase of the effective barrier width (provided by the ferroelectric layer 26) which, in turn, corresponds to a condition of low device conductance (i.e. between the conducting layers 22 and 24). It also follows that by switching the direction of polarization in the ferroelectric layer 26 between the conditions of FIG. 2 and FIG. 3 transitions the element 20 between ON and OFF states.

Although the aforedescribed switching results have been described with the element 20 whose conducting layers 22 and 24 are comprised of semiconductor materials, similar switching results can be had for degenerately doped metal oxide electrodes (i.e. conducting layers), in which minute differences in the Debye screening length or Thomas-Fermi screening length between dissimilar electrode materials or different interface conditions are sufficient to induce asymmetric transport behavior.

Figure 4:
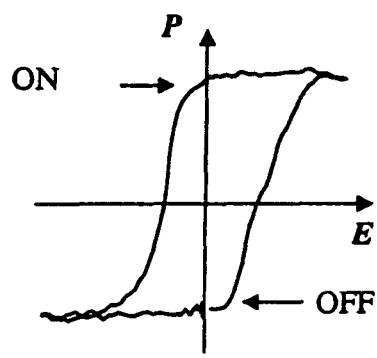
FIG. 4 is a plot of a typical hysteresis loop involving a ferroelectric material.

With reference to FIG. 4, there is illustrated a typical hysteresis curve for the material of the ferroelectric layer 26 and the corresponding conductance state of the element 20. (Within the FIG. 4 graph, the strength of the electric field, E, is plotted along the abscissa, and the size magnitude of the polarization, P, is plotted along the ordinate.) Given the typical hysteretic switching of the ferroelectric layer 26, the ON and OFF state of the element 20 persists when the switching bias is turned OFF (corresponding to the desired effect of non-volatile storage) and is stable with respect to smaller readout biases.

As mentioned above, it is a feature of the present invention that the electrodes 22 and 24 are dissimilar from one another in that the composition or construction of one electrode 22 is different from the composition or construction of the other electrode 24. Because the electrodes 22 and 24 are dissimilar in this respect, we use the term "asymmetric" herein in context with the structure of the tunneling element 20 of FIGS. 1-3 and we use the term "polarization dependent" in context with the electron transport behavior of the electrode material disposed on opposite sides of the ferroelectric layer 26.

Figure 5:
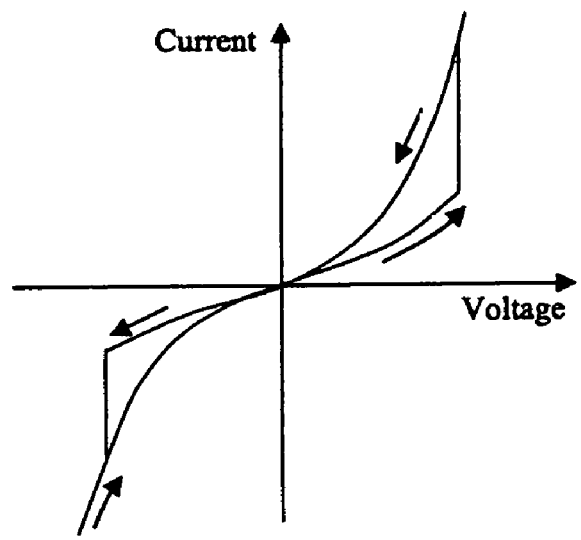
FIG. 5 is a plot of a hysteresis loop involving the FIG. 1 element.

More specifically, this asymmetry in the structure of the embodiment 20 gives rise to the hysteresis depicted on the voltage versus current plot of FIG. 5, and these hysterisis characteristics are directly linked to the switchable polarization in the ferroelectric layer 26 in that the FIG. 5 hysteresis characteristics will exist if and only if the electrodes 22 and 24 are dissimilar in composition or construction.

Therefore and as used in connection with the element 20, the term "polarization dependent" means that for a given level of voltage applied across the electrodes 22 and 24, the level, or magnitude, of the electrical current which can be passed in one direction between the electrodes 22 and 24 (e.g. corresponding with the direction of polarization in the ferroelectric layer 26) is different than the level of electrical current which can be passed in the other direction between the electrodes 22 and 24 (e.g. corresponding with the direction opposite the direction of polarization in the ferroelectric layer 26). Again, such a polarization dependency in the element 20 is due to the provision of the dissimilarity (either in composition or constuction) between the conductive (e.g. electrode) layers 22 and 24 of the element 20, rather than through the selection or build up of the ferroelectric layer 26.

Figure 6:
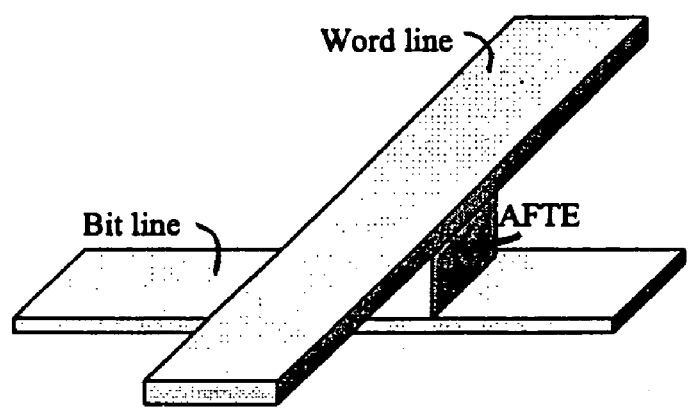
FIG. 6 is a perspective view illustrating schematically a memory structure which employs an embodiment of an asymmetric ferroelectric tunneling element within which features of the present invention are embodied.

Potential applications of the asymmetric ferroelectric tunneling element 20 include the non-volatile ferroelectric memory (depicted in FIG. 6), for both high-end computer systems and portable device applications. Within the memory structure of FIG. 6, an asymmetric ferroelectric tunneling element (e.g. like that of the tunneling element 20 of FIGS. 1-3) is located between the bit line and the word line, similar to a conventional DRAM (dynamic random access memory) element. Application of strong switching bias will allow switching between the ON and OFF state, while smaller bias can be used to probe the state of the asymmetric ferroelectric tunneling element. The advantage of such architecture is that the resistance of the element is probed, rather than the stored charge as is the case in conventional 1T-1C (one transistor, one capacitor) FeRAM (ferroelectric random access memory). This significantly simplifies the device design and leads to a minimization of the number of fabrication steps. At the same time, the minimal element size is no longer limited by the stored charge on the ferroelectric capacitor, providing increased potential for ultrahigh density RAM devices. Furthermore, it is also expected that a RAM device which incorporates an asymmetric ferroelectric tunneling element (i.e. an AFTE-RAM device) will possess the same advantages as conventional FeRAM, including non-volatility, high writing speed (about 50 ns, compared to 1 μs-1 ms for Flash and EEPROM and similar to DRAM), low-power consumption (write energy is 1 pJ compared to 10 pJ-200 nJ for Flash memory) and high write endurance ($>10^{12}$ cycles compared to $10^6$ cycles for EEPROM). Notably, the challenges in fabrication of an asymmetric ferroelectric tunneling element-incorporating device are similar to that of MRAM, perceived as one of the leading candidates for non-volatile memory technologies. However, the polarization dependence of switching current is much stronger in the asymmetric ferroelectric tunneling element-incorporating device, resulting in potentially higher signal to noise ratio.

Figure 7:
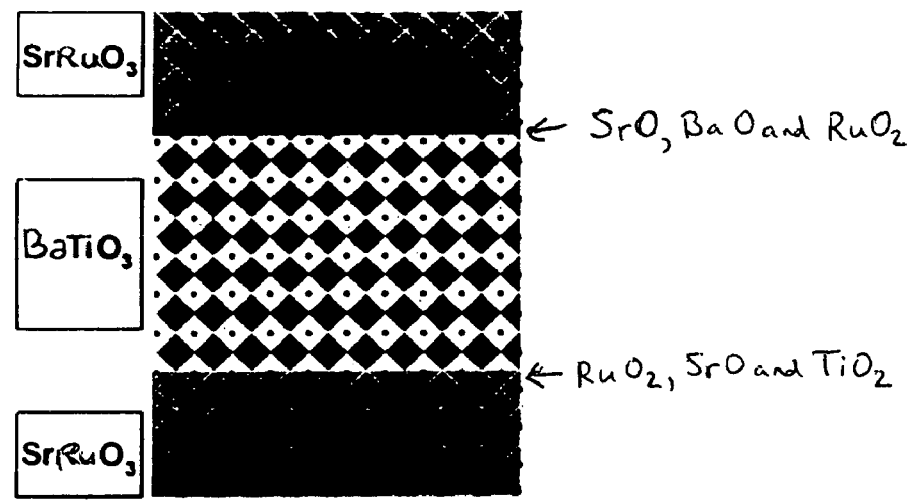
FIG. 7 is a cross-sectional view of another embodiment of a tunnel element within which the present invention is embodied.

With reference to FIG. 7, there is illustrated a prototypical asymmetric ferroelectric tunneling element (AFTE) system based on metallic oxide I/Ferroelectric/Metal Oxide II. The metal oxide (MO) I and MO-II is strontium ruthenate or LSMO, and the ferroelectric can be barium titanate or PZT. The advantage of these material systems is that the nearlyideal films with low defect density and perfect interfaces can be prepared, facilitating future experimental implementation of devices which incorporate the AFTE system. As suggested earlier and in order for the AFTE to operate, the electronic structure of the composition or structure of the material of the conducting (i.e. electrode) layers adjacent the conducting layer/ferroelectric interfaces must be dissimilar. For example, even the apparently symmetric $SrRuO_3/BaTiO_3/SrRuO_3$ system is in fact asymmetric. This is due to the fact that during the pulsed laser deposition growth, the $ABO_3$ perovskite is, in most situations, terminated by a $BO_2$ layer, hence the layer sequence for this heterostructure is $SrO—RuO_2—SrO—TiO_2—(BaTiO_3)_n—BaO—RuO_2—SrO$, in other words, on the lower interface is effectively strontium titanate, while the top one is barium ruthenate, making the structure asymmetric. It should be noted that given the extremely short decay length for the tunneling, $k^{-1}1$ Å, a minute difference in the Thomas-Fermi screening length, significantly smaller than the unit-cell can give rise to a factor of two difference in the conductivity, which is sufficient for device operation (compare for about 1-20% for magnetic tunneling devices). This asymmetry, in fact, can be responsible for experimentally observed polarization-dependent tunneling effect in "symmetric" structures, or in other words, in structures whose materials disposed adjacent the conducting layer/ferroelectric layer interfaces and on opposite sides of the ferroelectric layer are identical to one another.

An experimental group in the condensed matter sciences division at Oak Ridge National Laboratory has demonstrated the feasibility of fabricating a single atomically abrupt ferroelectric/$SrRuO_3$ interface with negligibly low defect density, making AFTE devices experimentally feasible. However, in order to design optimal devices, a greater understanding of the electronic structure at the interface, the electronic processes governing device operation and how the confinement and size effects influence the stability of the ferroelectric polarization is necessary.

In the meantime, a plane-wave pseudo-potential ab initio approach can be employed to allow for the description of the salient physical features of the proposed new class of electronic device. An important initial step consists in the atomistic description of the interface itself, including molecular and electronic relaxations. This initial step ultimately leads to a more detailed understanding of the physical process governing the robustness of the polarization driven functioning of the device. Actual calculations of the ferroelectricity in the multi-layered material can be performed by the state-of-the-art techniques, such as the superlattice approach for polarization. The unique aspects of the electronic properties of superlattices such as the ones being investigated here are characterized by a spontaneous polarization field, which is a direct consequence of the polar nature of the ferroelectric layer.

Figure 8:
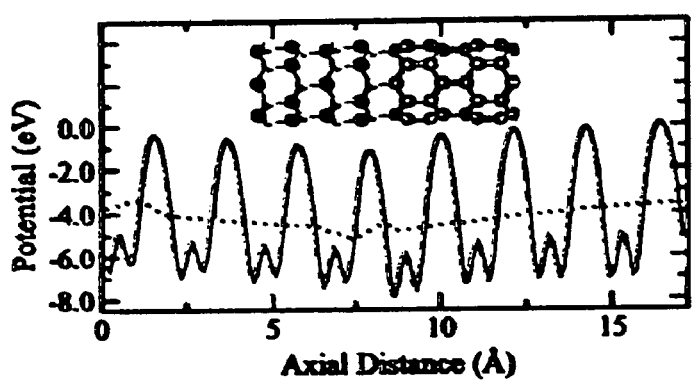
FIG. 8 is a graph of experimental results which substantiate the presence of a spontaneous polarization field superimposed onto a periodic crystalline potential.

In a periodic superlattice of polar and nonpolar materials, the spontaneous polarization field manifests in the behavior, in space, of the electrostatic potential of the system. In fact and as exemplified by the graph of FIG. 8, the latter displays a typical saw-tooth behavior that is the signature of the presence of a spontaneous polarization field superimposed onto the periodic crystalline potential. For convenience, we compute the planar average of the electrostatic potential along the system stacking direction (FIG. 8). This average, taken over the two directions perpendicular to the stacking direction, displays strong oscillations, which are the consequences of the varying strength of the ionic potentials. The effect is subtracted out using a method known as the one-dimensional macroscopic average of the electrostatic potential of the system. The value of the polarization field can then be obtained from the slope of the macroscopic average potential, and the band structure, including effect of intrinsic polarization, band bending due to charge redistribution, and effect of external potential can be derived for varying layer width and composition.

As the next step, the electronic processes governing the quantum transport through the device modeled as an open-system, i.e. a layer of oxide being sandwiched between two semi-infinite crystal made up of the other oxide forming the asymmetric junction, is investigated. The key difference between the quantum transport and ground-state calculations lies in boundary conditions (e.g. an "open" versus "closed" system). Quantum transport theory has existed for at least two decades as a subfield of condensed matter physics, and substantial interest has been shown in adapting quantum transport methods to the molecular and atomic levels. In fact, over the past three years, several groups, including the inventors of the instant invention, have developed quantum transport models that are based upon ab initio electronic structure methods.

For equilibrium states, such methods have been used to provide a theoretical framework for interpreting experimental results and even to predict accurate material and chemical properties before experimental data were available. The methodology for computing quantum transport is still being established and the field is being developed. One very promising method is known as the perturbative Green's function method which has been used to study the conductance in metallic nanowires and recently in small molecular nanocontacts. More importantly, we make use of our recently developed finite bias calculations which are based on the self-consistent evaluation of the charge density as a function of the applied bias (or electric field). These "out-of-equilibrium" calculations lead to a precise and accurate evaluation of the functioning of the proposed device under bias conditions, which together with recently acquired expertise in the real-space description of L (or R) originating Bloch states scattering into the C region, offers, for the first time, a comprehensive description of the electronic properties and processes within the novel material.

To summarize our substantiation of the transport behavior resulting in the ATFE described herein, we combine the ab-initio electronic structure calculation methods that can be used to adequately access the electronic structure of complex oxide material and heterostructures with the non-equilibrium Green's function approach developed at Oak Ridge National Laboratory to address for the first time finite-bias transport properties of asymmetric oxide heterostructures and, particularly, to extract polarization current-voltage characteristics.

It follows from the foregoing that an asymmetric ferroelectric tunneling element (AFTE) and memory device has been described which includes a thin film layer of ferroelectric material and a pair of dissimilar electrically-conductive layers disposed on opposite sides of the ferroelectric layer so that when the tunneling element is below the Curie temperature of the layer of ferroelectric material, the transport behavior of the conductive layers is asymmetric. In practice, the AFTE may provide the ultimately-desirable non-volatile random access memory of the future due to the provided high access times, non-volatility, low power consumption, radiation business, simple device architecture and ultimate scalability down to manometer sizes.

It will be understood that numerous modifications and substitutions can be had to the aforedescribed embodiments without departing from the spirit of the invention. For example, although the aforedescribed embodiment 20 has been shown and described as including conducting layers 22 and 24 comprised of n and p doped semiconductor materials, respectively, alternative compositions and structures of the conducting layers can be had. For example and in the instance in which the conducting layers are comprised of n and p doped semiconductor layers, such layers can be constructed to provide dissimilar carrier concentrations on opposite sides of the ferroelectric layer. In such a case, ferroelectric polarization results in the formation of an accumulation layer on one boundary and a depletion layer on the other boundary; however, the spatial extent of the depletion region and hence device resistance is dependent on polarization orientation.

Furthermore, there can exist an AFTE based on symmetic semiconductor-ferroelectric-semiconductor or metallic oxide-ferroelectric-metallic oxide structure possessing a different density of interface state (created deliberately during the deposition process by introducing of low concentration of aliovalent dopant or formed by the intrinsic difference in successive growth). In this case, the filling of the interface states results in the different extent of depletion layers.

Further still, there also can exist an AFTE based on the metal-ferroelectric-semiconductor structure. In this case, switching of ferroelectric element creates depletion or accumulation layer in semiconductor component, resulting in the change of effective thickness of tunneling barrier.

Moreover, there also can exist an AFTE based on oxide metal 1-ferroelectric-oxide metal 2 structure (e.g. $SrRuO_3$—($BaTiO_3$ or PZT)-$La_xSr_{1-x}MnO_3$). In this case, the switching action is due to the difference in the effective Debye length or Thomas-Fermi screening length in metallic oxides with different composition. This latter-mentioned modification can provide the most direct path for integrability into existing technology. As a potential development of the aforedescribed modifications, oxide materials with high dielectric constant (e.g. doped $SrTiO3$) can be used due to the good lattice match at the conducting layer/ferroelectric layer interfaces and the minimization of depolarization energy required to ensure the stability of ferroelectric phase in the ultrathin layer required for its use as a tunneling barrier.

Accordingly, the aforedescribed embodiments are intended for the purpose of illustration and not as limitation.

The invention claimed is:

1. A ferroelectric tunneling element comprising:
a thin film layer of ferroelectric material comprised of unit cells having polarizations which can be oriented in any of a number of random directions during build-up of the thin film layer; and
a pair of electrically-conductive layers disposed on opposite sides of the ferroelectric layer, one of the conductive layers being dissimilar to the other of the conductive layers in composition or construction so that when the tunneling element is below the Curie temperature of the layer of ferroelectric material, the conductive layers, by way of the dissimilarity in composition or construction between the conductive layers, act upon the unit cells of the ferroelectric layer so that the polarizations of the unit cells are arranged in a common direction and said common direction of polarization is oriented toward a predetermined one of the electrically-conductive layers of the tunneling element; and
wherein the material of the one conductive layer is an n-doped semiconductor material and the material of the other conductive layer is a p-doped semiconductor material.

2. A ferroelectric tunneling element comprising:
one layer of conducting material;
a thin film of ferroelectric material overlying and in contact with the one layer wherein the thin film of ferroelectric material is comprised of unit cells having polarizations which, during build-up of the thin film layer, can be oriented in any of a number of random directions; and
another layer of conducting material overlying and in contact with the layer of ferroelectric material, the layer of ferroelectric material having a polarization when at a temperature which is less than its Curie temperature so that unless a voltage higher than a threshold voltage is applied across the one and the another layers of conducting material, the layer of ferroelectric material provides a barrier to the flow of electrons between the one and the another layers; and
the one and the another layers of conducting material being dissimilar in composition or construction to one another so that the unit cells of the ferroelectric layer are acted upon by the dissimilarity in composition or construction between the one and another layers so that the polarizations of the unit cells are arranged in a common direction and so that said common direction of polarization is directed toward a predetermined one of the one and another conductive layers of the tunneling; and
wherein the material of the one conductive layer is an n-doped semiconductor material and the material of the other conductive layer is a p-doped semiconductor material.

3. A memory element characterized in that the memory element comprises a ferroelectric tunneling element comprising:
a thin film layer of ferroelectric material comprised of unit cells having polarizations which can be oriented in any of a number of random directions during build-up of the thin film, and
a pair of electrically-conductive layers disposed on opposite sides of the ferroelectric layer, one of the conductive layers being dissimilar to the other of the conductive layers in composition or construction so that when the tunneling element is below the Curie temperature of the layer of ferroelectric material, the conductive layers, by way of the dissimilarity in composition and construction between the conductive layers, act upon the unit cells of the ferroelectric layer so that the polarizations of the unit cells are arranged in a common direction and said common direction of polarization is oriented toward a predetermined one of the electrically-conductive layers of the memory element, and
wherein the material of the one conductive layer is an n-doped semiconductor material and the material of the other conductive layer is a p-doped semiconductor material.

* * * * *